United States Patent
Zheng et al.

(10) Patent No.: US 10,473,965 B2
(45) Date of Patent: Nov. 12, 2019

(54) ARRAY SUBSTRATE AND ITS MANUFACTURING METHOD AND DISPLAY PANEL

(71) Applicant: Wuhan China Star Optoelectronics Technology Co., Ltd., Wuhan, Hubei (CN)

(72) Inventors: Lihua Zheng, Guangdong (CN); Huanhuan Bu, Guangdong (CN); Pan Yang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 33 days.

(21) Appl. No.: 15/737,298

(22) PCT Filed: Oct. 20, 2017

(86) PCT No.: PCT/CN2017/106966
§ 371 (c)(1),
(2) Date: Dec. 17, 2017

(87) PCT Pub. No.: WO2019/041476
PCT Pub. Date: Mar. 7, 2019

(65) Prior Publication Data
US 2019/0064568 A1 Feb. 28, 2019

(30) Foreign Application Priority Data
Aug. 30, 2017 (CN) .......................... 2017 1 0767109

(51) Int. Cl.
*G02F 1/1333* (2006.01)
*G06F 3/041* (2006.01)
(Continued)

(52) U.S. Cl.
CPC ........ *G02F 1/13338* (2013.01); *G02F 1/1368* (2013.01); *G02F 1/13439* (2013.01);
(Continued)

(58) Field of Classification Search
CPC ........... G02F 1/13338; G02F 1/136277; G02F 1/136286; G02F 1/1368;
(Continued)

(56) References Cited

U.S. PATENT DOCUMENTS 6,897,110 B1 5/2005 He et al.
2013/0260496 A1 10/2013 Liu
(Continued)

FOREIGN PATENT DOCUMENTS

CN 102629046 A 8/2012
CN 104915052 * 9/2015 ............. G06F 3/041
(Continued)

*Primary Examiner* — Angela K Davison
(74) *Attorney, Agent, or Firm* — Andrew C. Cheng

(57) ABSTRACT

The present disclosure discloses an array substrate and its manufacturing method and display panel, wherein, the method for fabricating the array substrate including the steps of: providing a substrate; sequentially forming a TFT functional layer, a touch signal transmission line, a first insulating layer, a first electrode, and a second insulating layer on the substrate; forming a first via and a second via on the second insulating layer by photolithography; forming a second electrode and a metal pattern on the second insulating layer; wherein the metal pattern connects the touch signal transmission line and the first electrode through the first via, and the second electrode connects the source and/or drain through the second via. By the above-described method, the present disclosure can reduce the manufacturing process of the array substrate, thereby reducing the manufacturing cost of the array substrate.

7 Claims, 4 Drawing Sheets

(51) Int. Cl.
- *G02F 1/1362* (2006.01)
- *H01L 29/786* (2006.01)
- *G02F 1/1343* (2006.01)
- *H01L 21/02* (2006.01)
- *H01L 29/66* (2006.01)
- *H01L 27/12* (2006.01)
- *G06F 3/044* (2006.01)
- *G02F 1/1368* (2006.01)
- *G02F 1/1335* (2006.01)

(52) U.S. Cl.
CPC .. *G02F 1/133345* (2013.01); *G02F 1/134309* (2013.01); *G02F 1/136209* (2013.01); *G02F 1/136227* (2013.01); *G02F 1/136286* (2013.01); *G06F 3/044* (2013.01); *G06F 3/0412* (2013.01); *H01L 21/02532* (2013.01); *H01L 21/02592* (2013.01); *H01L 21/02675* (2013.01); *H01L 27/124* (2013.01); *H01L 27/1222* (2013.01); *H01L 27/1248* (2013.01); *H01L 27/1274* (2013.01); *H01L 29/66757* (2013.01); *H01L 29/78633* (2013.01); *H01L 29/78675* (2013.01); *G02F 1/133514* (2013.01); *G02F 2001/13685* (2013.01); *G02F 2001/134372* (2013.01); *G02F 2001/136295* (2013.01); *G02F 2202/104* (2013.01); *G06F 2203/04103* (2013.01)

(58) Field of Classification Search
CPC .......... G02F 2001/136295; G02F 2001/13685; G06F 3/0412; G06F 3/044; G06F 3/0443; H01L 27/1222; H01L 27/124; H01L 27/1248; H01L 29/66757; H01L 29/78633; H01L 29/78675
See application file for complete search history.

(56) References Cited

U.S. PATENT DOCUMENTS

2016/0299612 A1   10/2016   Lu et al.
2017/0192580 A1*   7/2017   Jung ..................... G06F 3/0416

FOREIGN PATENT DOCUMENTS

| CN | 104915052 A | 9/2015 |
| CN | 105161495 A | 12/2015 |
| CN | 106981252 A | 7/2017 |

* cited by examiner

US 10,473,965 B2

ARRAY SUBSTRATE AND ITS MANUFACTURING METHOD AND DISPLAY PANEL

FIELD OF THE DISCLOSURE

The present disclosure relates to a display technology field, and more particularly to an array substrate and its manufacturing method and display panel.

BACKGROUND OF THE DISCLOSURE

The existing capacitive touch screen structure has GFF (Glass-Film-Film), OGS (OneGlassSolution) as the representative of the Out Cell structure, On Cell structure, Hybrid In Cell structure and Full In cell structure. The Full In Cell structure refers to the method of embedding the touch function into the liquid crystal pixels, that is, embedding the touch sensor function inside the display screen, making the screen lighter and more transparent, and it is bound to become the mainstream structure of the future touch screen.

SUMMARY OF THE DISCLOSURE

The technical problem that the present disclosure mainly solves is to provide an array substrate and its manufacturing method and display panel, which can reduce the manufacturing process of the array substrate, thereby reducing the production cost of the array substrate.

In order to solve the above-mentioned technical problems, a technical solution adopted by the present disclosure is: to provide a method for manufacturing an array substrate, the method including the steps of: providing a substrate; sequentially forming a TFT functional layer, a touch signal transmission line, a first insulating layer, a first electrode, and a second insulating layer on the substrate; wherein the first electrode serves both as a common electrode and also as a touch sensor; forming a first via and a second via on the second insulating layer by photolithography; wherein the first via causes the touch signal transmission line and the first electrode to be exposed, and the second via exposes a source and/or a drain in the TFT functional layer; forming a second electrode and a metal pattern on the second insulating layer; wherein the metal pattern connects the touch signal transmission line and the first electrode through the first via, and the second electrode connects the source and/or drain through the second via.

In order to solve the above-mentioned technical problems, another aspect of the present disclosure is to provide an array substrate, the array substrate includes a substrate, a TFT functional layer, a touch signal transmission line, a first insulating layer, a first electrode, a second insulating layer, a second electrode, and a metal pattern arranged in this order; wherein the first electrode serves both as a common electrode and also as a touch sensor; wherein the second insulating layer is arranged with a first via and a second via formed by photolithography, the first via exposing the touch signal transmission line and the first electrode, the second via exposing the source and/or drain in the TFT functional layer; wherein the second electrode and the metal pattern are fabricated using the same metal layer, the metal pattern connects the touch signal transmission line and the first electrode through the first via, the second electrode connecting the source and/or drain through the second via.

In order to solve the above-mentioned technical problems, the other aspect of the present disclosure is to provide a display panel including an array substrate, a color film substrate, and a liquid crystal layer between the array substrate and the color film substrate, wherein the array substrate is fabricated using the above-described fabrication method, or the array substrate is an array substrate as above.

The disclosure has the advantages that the method includes the following steps: different from the prior art, the method for manufacturing the array substrate provided by the disclosure includes: providing a substrate; sequentially forming a TFT functional layer, a touch signal transmission line, a first insulating layer, a first electrode, and a second insulating layer on the substrate; wherein the first electrode serves both as a common electrode and also as a touch sensor; forming a first via and a second via on the second insulating layer by photolithography; wherein the first via causes the touch signal transmission line and the first electrode to be exposed, and the second via exposes a source and/or a drain in the TFT functional layer; forming a second electrode and a metal pattern on the second insulating layer; wherein the metal pattern connects the touch signal transmission line and the first electrode through the first via, and the second electrode connects the source and/or drain through the second via. By the above-described method, the fabrication of the array substrate can be reduced, thereby reducing the manufacturing cost of the array substrate.

DETAILED DESCRIPTION OF PREFERRED EMBODIMENTS

In the embodiment of the present disclosure, a self-capacitive Full In Cell touch technique is used, generally use the pattern of the common electrode as a touch sensor, using Display & Touch time-driven way to achieve the purpose of reducing the noise signal processing.

Figure 1:
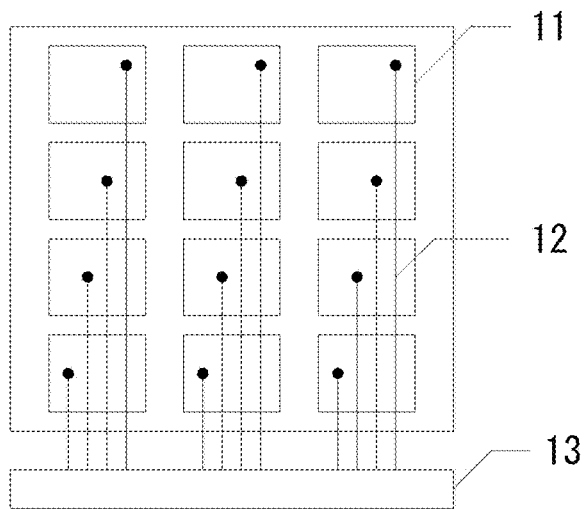
FIG. 1 is a schematic top view of the embodiment of the array substrate provided by the present disclosure.

Refer to FIG. 1, FIG. 1 is a schematic top view of the embodiment of the array substrate provided by the present disclosure, the array substrate includes at least a plurality of common electrodes 11 arranged in an array, at the same time, each common electrode 11 also serves as a touch sensor for the array substrate. Wherein each of the common electrodes 11 is connected to the controller 13 through a touch signal transmission line 12.

It is to be understood that at the first timing, the common electrode 11 receives the common electrode signal transmitted by the controller 13 through the touch signal transmission line 12, at this time, the pixel electrode receives the data signal, and an electric field is formed between the common electrode 11 and the pixel electrode to change the deflection direction of the liquid crystal molecules to realize the display function. In the second timing, the common electrode 11 serves as a touch electrode, receives an external touch signal, and transmits the touch signal to the controller 13 through the touch signal transmission line 12 to realize a touch control function.

Among them, in the FFS (Fringe Field Switching) display technology, the pixel electrode is arranged on the array substrate.

Figure 2:
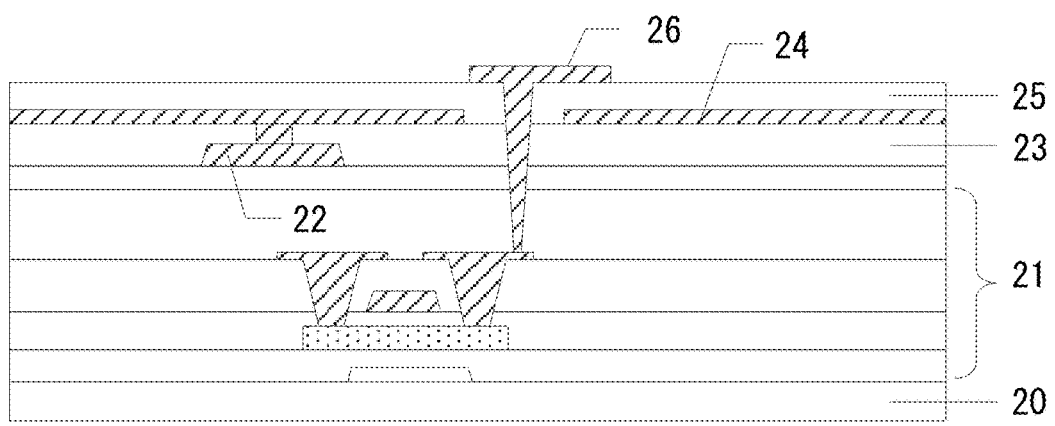
FIG. 2 is a schematic diagram of the connection between the common electrode and the touch signal transmission line in the prior art.

Refer to FIG. 2, FIG. 2 is a schematic diagram of the connection between the common electrode and the touch signal transmission line in the prior art.

In the prior art, the array substrate includes a substrate 20 and a TFT functional layer 21, a touch signal transmission line 22, a first insulating layer 23, a first electrode 24, a second insulating layer 25, and a second electrode 26 laminated on the substrate 20, respectively.

Wherein a via is formed on the first insulating layer 23 by a photolithography etch before the first electrode 24 is formed, when the first electrode 24 is fabricated, the first electrode 24 is connected to the touch signal transmission line 22 through the via, before forming the second electrode 26, a via is formed on the second insulating layer 25 by another photolithography, when the second electrode 26 is fabricated, the second electrode 26 is connected to the source and/or the drain in the TFT functional layer 21 through the via.

It can be seen that in the prior art, it is necessary to realize the connection of the first electrode 24 and the second electrode 26 by two different photolithography processes, respectively.

Figure 3:
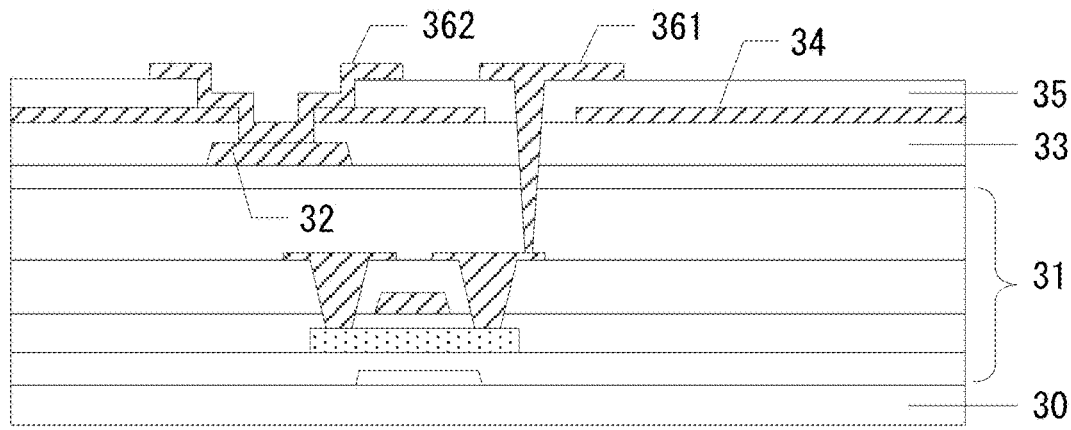
FIG. 3 is a schematic side elevational view of the embodiment of the array substrate provided by the present disclosure.

Refer to FIG. 3, FIG. 3 is a schematic side elevational view of the embodiment of the array substrate provided by the present disclosure, the array substrate includes a substrate 30 and a TFT functional layer 31, a touch signal transmission line 32, a first insulating layer 33, a first electrode 34, a second insulating layer 35 and a second electrode 361, and a metal pattern 362 laminated on the substrate 30.

wherein, the first electrode 34 serves both as a common electrode and as a touch sensor.

Wherein the second insulating layer is provided with a first via (not identified) and a second via (not identified) formed by photolithography, the first via causes the touch signal transmission line 32 and the first electrode 34 to be exposed, and the second via causes the source and/or drain in the TFT functional layer 31 to be exposed.

Wherein, the second electrode 361 and the metal pattern 362 are made of the same metal layer, the metal pattern 362 connects the touch signal transmission line 32 and the first electrode 34 through the first via, and the second electrode 361 connects the source and/or the drain through the second via.

Wherein the TFT functional layer 31 includes a light-shielding layer, a buffer layer, an active layer, a gate insulating layer, a gate, an interlayer dielectric layer, a source/drain, and a flat layer, wherein, a third via and a fourth via are formed on the interlayer dielectric layer by etching, the third via exposes the source region of the active layer, the fourth via exposes the drain region of the active layer; the source is connected to the source region through the third via, and the drain is connected to the drain region through the fourth via. The specific configuration in the TFT function 31 is merely illustrative and does not limit the present embodiment, and the specific structure of the TFT functional layer 31 will be described in the following embodiments, and will not be described again.

Optionally, the first via includes a first through hole extending through the second insulating layer 35 and a second through hole extending through the first electrode 34 and the first insulating layer 33; Wherein the width of the first through-hole is greater than the width of the second through hole so that the bottom of the first through hole exposes the portion of the upper surface of the first electrode 34, the bottom of the second through hole exposes a portion of the upper surface of the touch signal transmission line 32. In this way, the metal pattern 362 can be made to be in contact with the touch signal transmission line 32 and the first electrode 34 in a better manner.

It is to be noted that since the via of the metal pattern 362 and the via of the second electrode 361 are completed in one process and only one mask is used, the present embodiment can reduce the process of manufacturing the array substrate and save the cost.

Hereinafter, the present disclosure will be described with reference to examples of the production method of the array substrate provided by the present disclosure.

Figure 4:
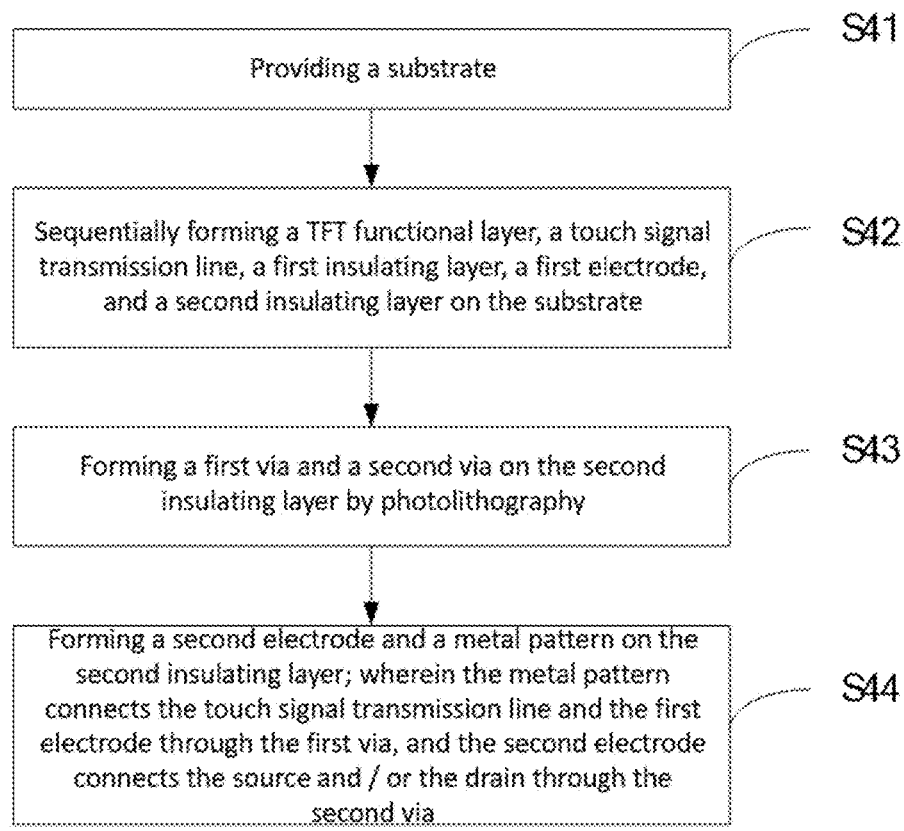
FIG. 4 is a flow diagram of the embodiment of the method of manufacturing the array substrate provided by the present disclosure.

Refer to FIG. 4, FIG. 4 is a flow diagram of the embodiment of the method of manufacturing the array substrate provided by the present disclosure, which includes:

S41: Providing a substrate.

Alternatively, the substrate is generally a transparent glass substrate, and if used as a flexible display screen, the substrate may also be made of a suitable flexible material, such as polyethylene terephthalate (PET) or polyethylene naphthalate (PEN), but this embodiment is not limited thereto.

S42: Sequentially forming a TFT functional layer, a touch signal transmission line, a first insulating layer, a first electrode, and a second insulating layer on the substrate.

Figure 5:
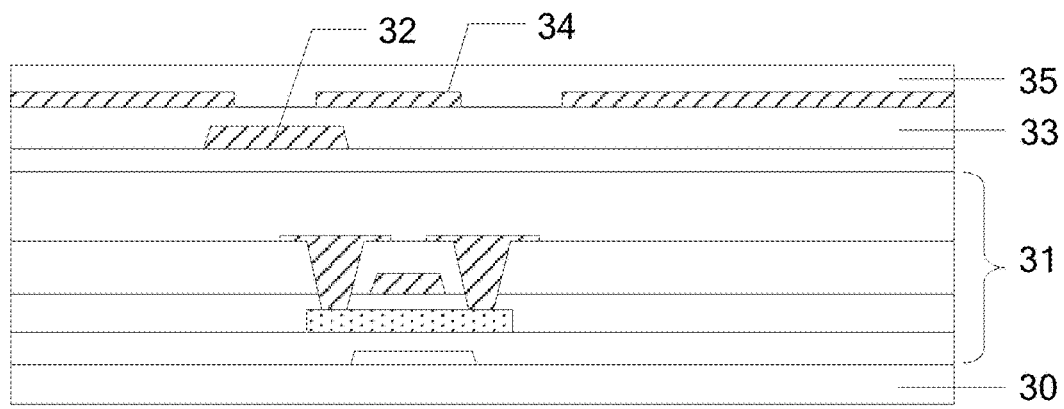
FIG. 5 is a schematic structural view of step S42 in the embodiment of the method for manufacturing the array substrate provided by the present disclosure.

As shown in FIG. 5, sequentially forming a TFT functional layer 31, a touch signal transmission line 32, a first insulating layer 33, a first electrode 34, and a second insulating layer 35 on the substrate 30.

The first electrode 34 is formed on the first insulating layer 33, specifically, a metal layer is formed on the first insulating layer 33, and the metal layer is patterned to obtain the first electrode 34.

It is to be understood that, as described above, the first electrode 34 serves both as a common electrode and as a touch sensor, i.e., a touch electrode.

S43: Forming a first via and a second via on the second insulating layer by photolithography; wherein the first via causes the touch signal transmission line and the first electrode to be exposed, and the second via causes the source and/or drain in the TFT functional layer to be exposed.

Figure 6:
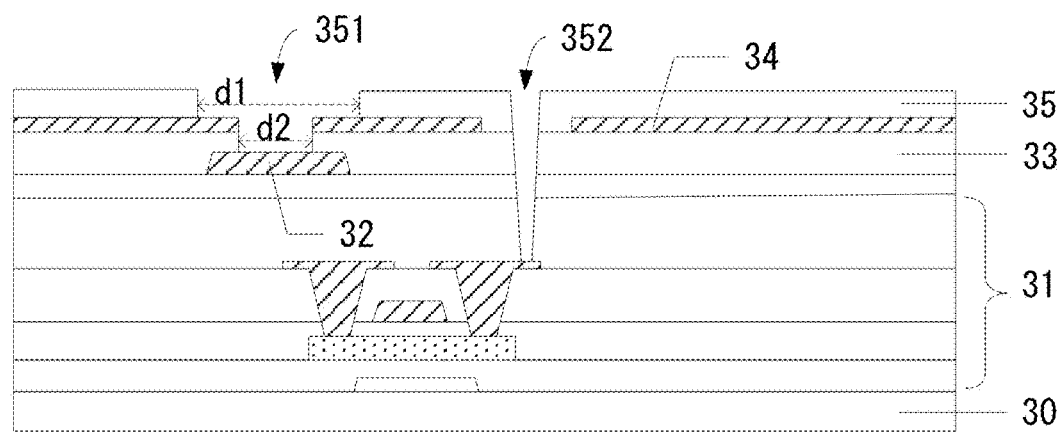
FIG. 6 is a schematic structural view of step S43 in the embodiment of the method for manufacturing the array substrate provided by the present disclosure.

As shown in FIG. 6, forming a first via 351 and a second via 352 on the second insulating layer 35 by photolithography; wherein the first via 351 exposes the touch signal transmission line 32 and the first electrode 34, and the second via 352 exposes the source and/or the drain in the TFT functional layer 31.

Optionally, in a particular embodiment, the first via 351 includes a first through hole (not shown) extending through the second insulating layer 35 and a second through hole (not shown) extending through the first electrode 34 and the first insulating layer 33; wherein the width d1 of the first through hole is larger than the width d2 of the second through hole so that the bottom of the first through hole exposes the upper surface of the portion of the first electrode 34, the bottom of the second through hole exposes a portion of the upper surface of the touch signal transmission line 32.

S44: Forming a second electrode and a metal pattern on the second insulating layer; wherein the metal pattern connects the touch signal transmission line and the first electrode through the first via, and the second electrode connects the source and/or the drain through the second via.

Figure 7:
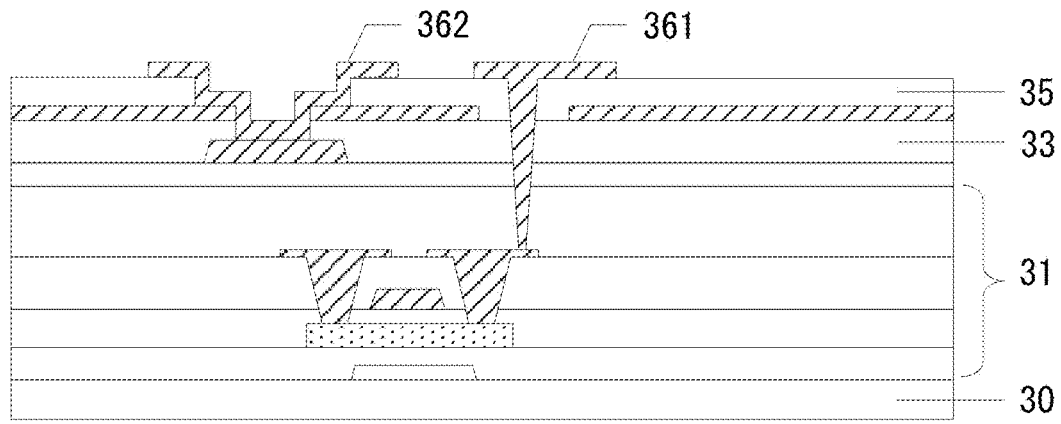
FIG. 7 is a schematic structural view of step S44 in the embodiment of the method for manufacturing the array substrate provided by the present disclosure.

As shown in FIG. 7, forming the second electrode 361 and the metal pattern 362 on the second insulating layer 35; wherein the metal pattern 362 connects the touch signal transmission line 32 and the first electrode 34 through the first via 351, and the second electrode 361 connects the source and/or the drain through the second via.

Optionally, in the above-described implementation step, S42 may specifically include:

forming a TFT functional layer on the substrate; forming a first metal layer on the TFT functional layer and patterning the first metal layer to obtain a touch signal transmission line; forming a first insulating layer on the first metal layer; forming a second metal layer on the first insulating layer and patterning the second metal layer to obtain a first electrode; forming a second insulating layer on the second metal layer.

Optionally, in the above-described implementation step, S44 may specifically include:

forming a third metal layer on the second insulating layer, and patterning the third metal layer to obtain a second electrode and a metal pattern.

Wherein the second metal layer and the third metal layer are obtained by depositing ITO (indium tin oxide).

Figure 8:
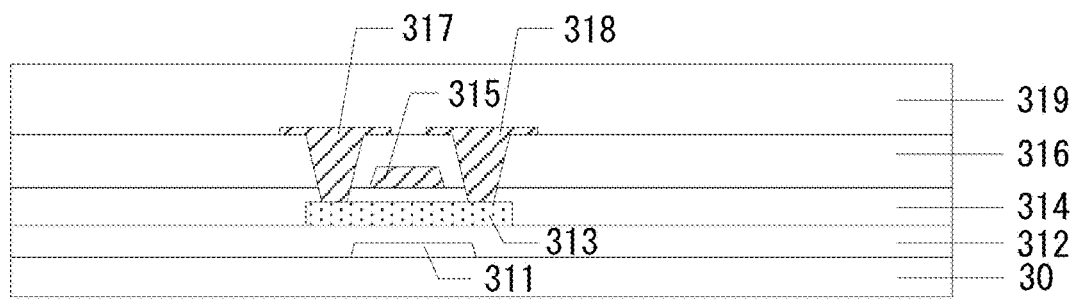
FIG. 8 is a schematic structural view of the TFT functional layer in the embodiment of the method for fabricating the array substrate provided by the present disclosure.

Alternatively, as shown in FIG. 8, in the above-described embodiment, the step of forming the TFT functional layer on the substrate may specifically include:

forming a light blocking layer 311 on the substrate; forming a buffer layer 312 on the light blocking layer 311; forming the active layer 313 on the buffer layer 312 and forming the source region (unlabeled) and the drain region (not identified) by doping; forming a gate insulating layer 314 on the active layer 313; forming a gate electrode 315 on the gate insulating layer 314; forming an interlayer dielectric layer 316 on the gate electrode 315; etching the interlayer dielectric layer 316 to form a third via and a fourth via; wherein the third via hole exposes the source region and the fourth via hole exposes the drain region; a source electrode 317 and a drain electrode 318 are formed on the interlayer dielectric layer 316; the source 317 is connected to the source region through the third via, the drain 318 is connected to the drain region through the fourth via, and the flat layer 319 is formed on the source 317 and the drain 318.

Wherein the light blocking layer 311 serves to block the influence of the light on the active layer 313 and to prevent the influence of the photogenerated carriers on the performance of the active layer 313.

Wherein, the active layer 313 can be prepared by: first depositing an amorphous silicon (a-si) layer and then crystallizing the amorphous silicon layer into an amorphous silicon (poly-Si) layer by an excimer laser annealing (ELA) process, and then the polysilicon layer is patterned and ion-doped to form an active layer including a source region and a drain region.

The buffer layer 312, the gate insulating layer 314, and the interlayer dielectric layer 316 are generally inorganic materials. Specifically, SiOx, SiNx, or a mixture of SiOx and SiNx may be used. The flat layer 319 is generally an organic material and is not required here.

It will be appreciated that in the process of fabricating an array substrate, it is often necessary to form some electrodes, and we typically deposit a layer of metal and then form a specific pattern by etching. In the present embodiment, a total of 5 layers of metal, i.e., M1-M5, are required to be deposited, as described below in connection with FIGS. 5 to 8 described above:

M1: when the gate electrode 315 is formed, M1 is formed, and a gate pattern is formed by etching;

M2: when the source 317 and the drain 318 are fabricated, M2 is formed, and the source pattern and the drain pattern are formed by etching;

M3: when the touch signal transmission line 32 is made, M3 is formed, and then the touch signal transmission line pattern is formed by etching;

M4: when the first electrode 34 is formed, M4 is formed, and a common electrode pattern (i.e., a touch electrode pattern) is formed by etching;

M5: when the second electrode 36 and the metal pattern are formed, M5 is formed, and the second electrode pattern and the metal pattern are formed by etching.

Wherein, M1-M3 can be aluminum, copper and other metals, M4, M5 for the transparent metal materials, such as ITO.

In the present embodiment, after the M5 patterning, the metal pattern therein becomes a bridging portion connecting the touch signal transmission line and the first electrode, reducing the photolithography process and reducing the cost.

Figure 9:
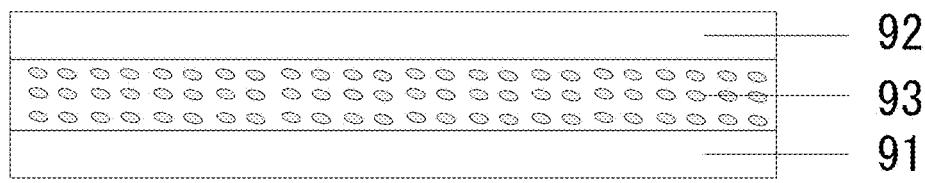
FIG. 9 is a schematic structural view of the embodiment of the display panel according to the present disclosure.

Refer to FIG. 9, FIG. 9 is a schematic structural view of the embodiment of the display panel according to the present disclosure, the display panel includes an array substrate 91, a color film substrate 92, and a liquid crystal layer between the array substrate 91 and the color film substrate 92.

The array substrate 91 is fabricated using the manufacturing method provided in the above embodiment, or the array substrate 91 is an array substrate provided as in the above embodiment. The structure and working principle are similar to those of the array substrate in the above embodiment, and will not be described here.

The foregoing is merely an embodiment of the present disclosure and is not intended to limit the scope of the disclosure, any equivalent structural or equivalent process transformation using the present specification and the accompanying drawings, either directly or indirectly, in other related technical fields, are likewise included within the scope of the patent protection of the present disclosure.

What is claimed is:

1. An array substrate comprising a substrate, a TFT functional layer, a touch signal transmission line, a first insulating layer, a first electrode, a second insulating layer, a second electrode, and a metal pattern, wherein the substrate, the TFT functional layer, the touch signal transmission line, the first insulating layer, the first electrode and the second insulating layer are sequentially stacked, the second electrode and the metal pattern are stacked on the second insulating layer;

wherein the first electrode serves both as a common electrode and also as a touch sensor;

wherein the second insulating layer is arranged with a first via and a second via formed by photolithography, the first via comprises a first through hole extending through the second insulating layer and a second through hole, the second through hole comprises a first sub-through hole extending through the first electrode and a second sub-through hole extending through the first insulating layer, a width of the first sub-through hole is equal to a width of the second sub-through hole, a width of the first through hole is larger than the width of the first sub-through hole and the width of the second sub-through hole so that the bottom of the first through hole exposes a portion of the upper surface of the first electrode, the bottom of the second through hole exposes a portion of the upper surface of the touch signal transmission line, the second via making the source and/or drain in the TFT functional layer exposed;

wherein the second electrode and the metal pattern are fabricated using the same metal layer, the metal pattern connects the touch signal transmission line and the first electrode through the first via, the second electrode connecting the source and/or drain through the second via.

2. The array substrate according to claim 1, wherein the touch signal transmission line, the first insulating layer, the first electrode, the second insulating layer, the second electrode and the metal pattern are fabricated by the following method:

forming a first metal layer on said TFT functional layer and patterning said first metal layer to obtain the touch signal transmission line;

forming the first insulating layer on said first metal layer;

forming a second metal layer on said first insulating layer and patterning said second metal layer to obtain the first electrode;

forming the second insulating layer on said second metal layer.

3. The array substrate according to claim 1, wherein the first electrode, the second electrode, and the metal pattern are fabricated using ITO.

4. The array substrate according to claim 1, wherein the TFT functional layer comprises a light-shielding layer, a buffer layer, an active layer, a gate insulating layer, a gate, an interlayer dielectric layer, a source/drain, and a flat layer;

wherein the interlayer dielectric layer is arranged with a third via and a fourth via formed by etching, the third via exposes a source region of the active layer, the fourth via exposes a drain region of the active layer; the source electrode is connected to the source region through the third via, the drain electrode is connected to the drain region through the fourth via.

5. The array substrate according to claim 4, wherein the TFT functional layer is fabricated by the following method:

forming a light-shielding layer on the substrate;

forming a buffer layer on the light blocking layer;

forming an active layer on the buffer layer and forming a source region and a drain region by doping;

forming a gate insulating layer on the active layer;

forming a gate on the gate insulating layer;

forming an interlayer dielectric layer on the gate electrode;

etching on the interlayer dielectric layer to form a third via and a fourth via; wherein the third via exposes the source region, the fourth via exposes the drain region;

forming a source and a drain on the interlayer dielectric layer; wherein the source is connected to the source region through the third via, the drain is connected to the drain region through the fourth via;

forming a flat layer on the source and the drain.

6. The array substrate according to claim 5, wherein the buffer layer, the gate insulating layer, and the interlayer dielectric layer are made of an inorganic material, and the flat layer is made of an organic material.

7. The array substrate according to claim 6, wherein the inorganic material is SiOx, SiNx, or a mixture of SiOx and SiNx.

* * * * *